United States Patent [19]

Kitahori et al.

[11] Patent Number: 4,734,640

[45] Date of Patent: Mar. 29, 1988

[54] WELDING CURRENT MEASURING APPARATUS

[75] Inventors: Reiji Kitahori; Masato Furudate, both of Kanagawa, Japan

[73] Assignee: Dengensha Manufacturing Co., Ltd., Kanagawa, Japan

[21] Appl. No.: 839,382

[22] Filed: Mar. 14, 1986

[30] Foreign Application Priority Data

Mar. 20, 1985 [JP] Japan .................................. 60-56457

[51] Int. Cl.⁴ ............................................ G01R 19/165
[52] U.S. Cl. .................. 324/127; 324/77 A; 324/111; 324/121 R; 219/109
[58] Field of Search ............... 324/126, 102, 127, 132, 324/133, 112, 121, 77 A, 111; 340/664; 364/483, 487; 279/109, 55

[56] References Cited

U.S. PATENT DOCUMENTS

| 3,034,057 | 5/1962 | Ferguson | 324/132 |
|---|---|---|---|
| 3,962,694 | 6/1976 | Calia et al. | 340/664 |
| 4,006,413 | 2/1977 | Silberberg | 324/102 |
| 4,142,146 | 2/1979 | Schumann et al. | 324/121 R |
| 4,225,940 | 9/1980 | Moriyasu et al. | 324/121 R |
| 4,241,336 | 12/1980 | Schonken | 340/664 |
| 4,346,346 | 8/1982 | Silberberg | 324/132 |
| 4,388,611 | 6/1983 | Haferd | 364/487 |
| 4,399,511 | 8/1983 | Jurek | 364/483 |
| 4,434,351 | 2/1984 | Nakata et al. | 219/109 |
| 4,471,348 | 9/1984 | London et al. | 324/121 R |
| 4,608,648 | 8/1986 | Oogaki | 364/483 |
| 4,623,967 | 11/1986 | Naimer | 364/483 |

FOREIGN PATENT DOCUMENTS

| 0023708 | 2/1981 | European Pat. Off. | 324/133 |
|---|---|---|---|
| 0074235 | 3/1983 | European Pat. Off. | 364/487 |

Primary Examiner—Reinhard J. Eisenzopf
Assistant Examiner—W. Burns
Attorney, Agent, or Firm—Sughrue, Mion, Zinn, Macpeak & Seas

[57] ABSTRACT

A welding current measuring apparatus for a resistance welding machine comprises a current detector for use in measuring and detecting welding current flowing through the resistance welding machine, a memory for successively storing and holding the current values detected over the whole energizing time, and a device for specifying a desired energizing cycle interval to compute and display current values after completion of welding, wherein any energizing cycle interval is specified at will after completion of welding so that the current values or the current waveform in the specified interval can be displayed.

4 Claims, 3 Drawing Figures

WELDING CURRENT MEASURING APPARATUS

BACKGROUND OF THE INVENTION

This invention relates to a welding current measuring apparatus intended to provide welding quality control for a resistance welding machine, and more particularly to such a measuring apparatus which allows the measurement of currents or the display of current waveforms in a given cycle interval by specifying the desired interval after completion of welding so as to trace the origin of poor welds, if any, over all energizing cycle intervals.

There is a conventional welding current measuring apparatus disclosed in Japanese Patent Publication No. 56-37037 entitled "Welding Current Monitoring Method and Apparatus."

Such a conventional welding current measuring method comprises the steps of; specifying an optional welding current sampling interval before the energization for welding and comparing a cumulative mean current in the desired sampling interval with a predetermined reference current value in order to judge the welding current intensity.

However, the conventional apparatus has the following shortcomings.

Since desired welding current sampling interval must be specified prior to energization for welding, i.e., before the current is measured, currents caused to flow in cycle intervals other than the specified one are ignored and thus are unmeasurable. It is often necessary to make the currents or current waveforms in the ignored intervals after completion of welding clear so as to trace the origin of a poor weld, if there are any. In that case, the only measure conventionally taken comprises again specifying the sampling interval and the reference current for the welding current monitoring level and attempting welding under the conditions assumed to be the same as those for the previous time. However, no complete reproducibility is guaranteed and there have been increasing difficulties in tracing the origins of poor welds.

SUMMARY OF THE INVENTION

The present invention is intended to eliminate such drawbacks. It is therefore an object of the invention to provide a welding current measuring apparatus comprising a current detector for use in measuring and detecting welding current flowing through the resistance welding machine, memory means for successively storing and holding the current values detected over the whole energizing time, and means for specifying a desired energizing cycle interval to compute and display current values after completion of welding. After completion of welding, any energizing cycle interval is specified at will so that the current values caused to flow or the current waveforms in the specified interval can be displayed.

According to the present invention, values or waveforms of currents flowing in a specified cycle interval can be confirmed anytime by specifying an energizing cycle interval after completion of welding. For example, it is known that no irregularity occurred in a 2→3 cycle interval shown in FIG. 1, whereas irregularity in the form of an "excessive" current occurred in a 5→6 cycle interval. Moreover, a current in a 8→9 cycle interval is seen to be small and to be distorted in waveform. In the case of a conventional apparatus, a cycle interval intended for measurement must be specified and preset prior to energization for welding. If a 2→4 cycle interval shown in FIG. 1 is specified, for instance, only that interval can be the target for measurement and, even if the currents flowing in the other cycle intervals (5→6, 8→9) are irregular if the current flowing in the specified interval is normal, that series of currents will be judged normal as a whole.

DETAILED DESCRIPTION OF THE INVENTION

Figure 1:
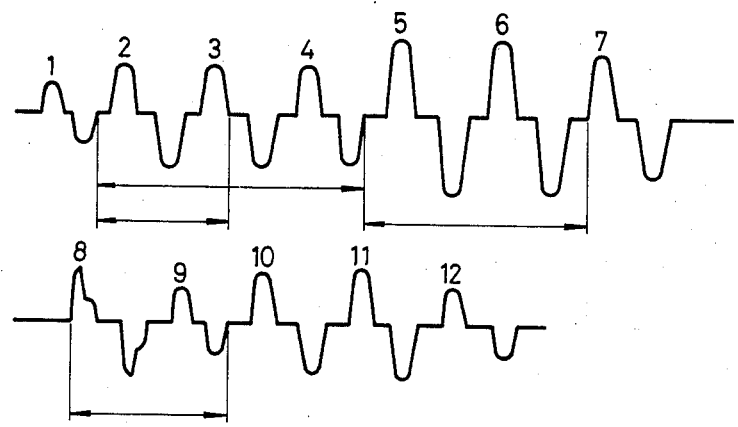
FIG. 1 illustrates one example of current waveforms in energizing welding current cycle intervals.
Figure 2:
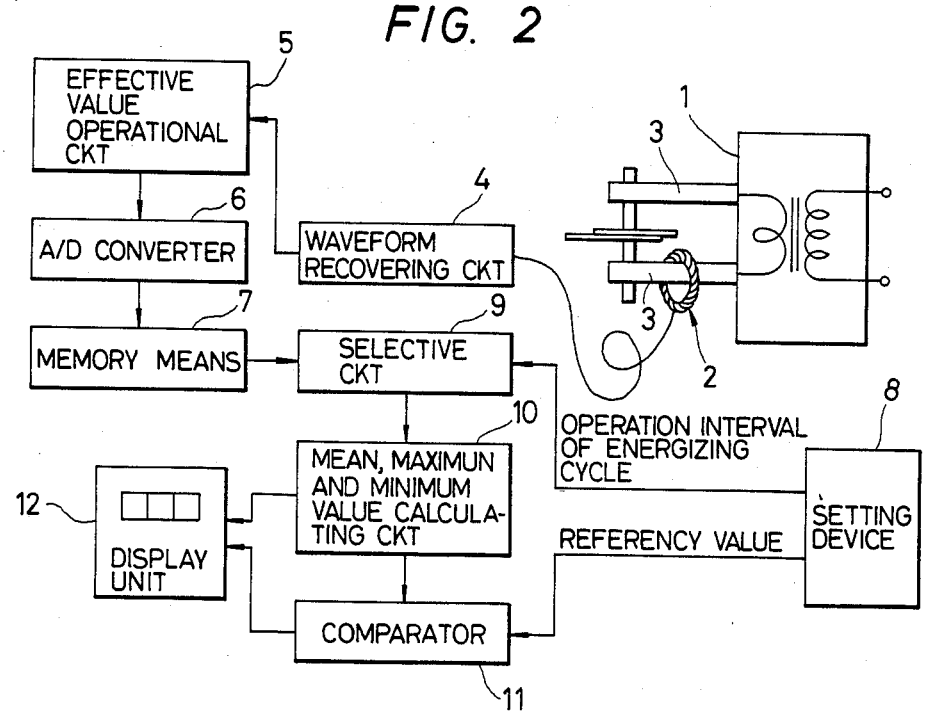
FIG. 2 is a block diagram illustrating an embodiment of an apparatus according to the present invention.

Referring now to the accompanying drawings, embodiments of the present invention will be described. FIG. 2 is a block diagram of an apparatus embodying the present invention. In FIG. 2, there is shown a spot welding machine 1 with a current detector 2 generally known as a toroidal coil and made by winding a copper wire in a ring form. The toroidal coil is provided at the secondary arm 3 of the welding machine and a large current, between several thousand to several ten thousand amperes is directly detected at the arm. A waveform recovering circuit 4 restores the differential waveform of the welding current as the output of the toroidal coil 2 to the original one through an integrating circuit before an effective operation is carried out. On receiving the output of the waveform recovering circuit, an effective value operational circuit 5 calculates a square root of the mean value of the square of an instantaneous current value (value in the instant) in a ½ cycle. An analog/digital converter 6 receives an analog output from the effective value operational circuit 5 and converts the output into digital data. A memory 7 stores and holds the digital data including the effective value data per semicycle over all energizing intervals. A setting device 8 supplies an operational interval of an energizing cycle and, sets as reference value a monitoring level for welding current, upper and lower limit values relative to a mean current value in the specified cycle interval and a lower limit value related to the minimum value as well as an upper limit value related to the maximum value. A selective circuit 9 selects and reads the effective value data in the operation interval specified by the setting device 8 from the memory means 7 and applies the data to an operational circuit described later. The operational circuit 10 for calculating mean, maximum and minimum values computes the mean values of the effective value data (plural) for every half cycle in the specified interval inputted by the selective circuit 9, and also finds out the greatest or smallest one among them. A comparator 11 compares the upper and lower values relative to a mean value, the upper limit value to the maximum value, and the lower limit value to the minimum value inputted from the setting device 8 as a reference value. The comparator 11 issues a warning output signal outside when the mean value is greater than its upper limit value or smaller than its lower limit value, or when the maximum value is greater than its upper limit value or the minimum value is smaller than its lower limit value. A display unit 12 receives a signal from the comparator 11 and displays the mean, maximum and minimum values.

The operation of the apparatus according to the present invention will subsequently be described. The welding current flowing through the secondary arm 3 of the welding machine 1 during the welding process is detected by the toroidal coil 2 and, as the current has a differential waveform, the current waveform is recovered by means of the waveform recovering circuit 4. Subsequently, effective values for every half cycle over all energizing cycle intervals are obtained from the effective value operational circuit 5. The effective values are subjected to A/D conversion, and stored and held in the memory means 7 as current values for every half cycle.

When the origin of a poor weld found in a welding zone after the completion of welding is traced, any cycle interval in the energizing cycle interval can be specified by the setting device 8. The current values in the specified operational interval are read out of the memory 7 by the selective circuit 9, and the mean, maximum and minimum values are respectively computed by the operational circuit 10. The results are supplied to the display unit 12 and also to the comparator 11 where they are compared with the reference values. A warning signal is applied to the display unit 12 through relay contacts and the like when the compared result is outside an allowable value range.

Figure 3:
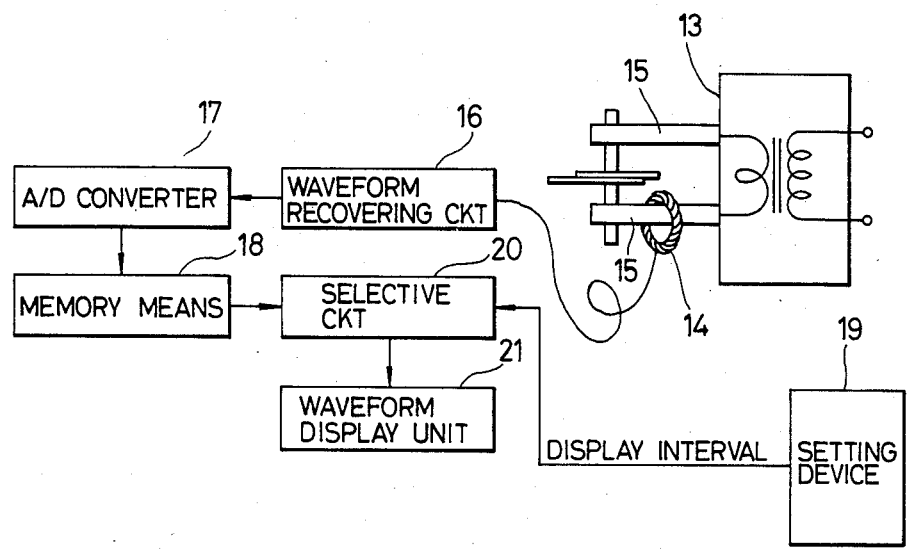
FIG. 3 is a block diagram illustrating another embodiment of an apparatus according to the present invention.

FIG. 3 is a block diagram illustrating another embodiment in which an investigation of the origins of poor welds can be carried out in detail by displaying current waveforms in a given interval.

The apparatus according to this embodiment will subsequently be described. The welding current flows through the secondary arm 15 of a welding machine 13 during the welding process and is detected by a toroidal coil 14. Since the current has a differential waveform, the current waveform is recovered by means of a waveform recovering circuit 16. On receiving analog data from the waveform recovering circuit 16, an analog/digital converter 17 successively converts it into digital data. Memory 18 successively stores the digital data. A setting device 19 sets a current waveform displaying interval, i.e., sets the initial cycle at which the display is initiated and the final cycle at which the display is finished. A selective circuit 20 reads the current data in the interval supplied by the setting device 19 from the memory 18 and supplies the data to a waveform display unit 21. The display unit 21 is an image display unit whose horizontal axis is a time axis and vertical axis is a current axis, and which displays the data sent out of the selective circuit 20 at positions corresponding to those values.

The current data at every moment, which is subjected to analog/digital conversion and stored and held by the memory 18, are, if their sampling time is sufficiently short, observable as a continuous current waveform when displayed on the waveform display unit 21. By specifying any given energizing cycle interval after completion of welding, it is possible to confirm in detail what types of irregularities have taken place and in which ones of the energizing cycles the irregularities have taken place.

As set forth above, the present invention allows the selection of any energizing cycle interval after completion of welding and the instant confirmation of types of irregularities in a given energizing cycle. In other words, it greatly contributes to poor weld analysis because current values or current waveforms in any cycle interval over all energizing cycle intervals can readily be known.

What is claimed is:

1. A welding current measuring apparatus for a resistance welding machine, comprising:
    a current detector for detecting welding current flowing through said resistance welding machine;
    memory means for successively storing and holding the current values detected; and
    means for specifying a desired energizing cycle interval for computing and displaying the currents after completion of welding;
    said energizing cycle interval being specified after completion of welding so that the value of a current flowing in said specified interval may be displayed.

2. A welding current measuring apparatus as claimed in claim 1, further comprising an arithmetic unit for obtaining mean, maximum and minimum values or any one thereof, of the welding current caused to flow in the specified interval; means for supplying a reference value for setting up a monitoring level of the welding current passing through said welding machine; a comparator for comparing the output obtained from said arithmetic unit with said reference value; and a display unit for displaying a compared result.

3. A welding current measuring apparatus for a resistance welding machine, comprising:
    a current detector for detecting welding current flowing through said resistance welding machine;
    a memory means for storing the current values detected by said detector over all energizing intervals;
    a setting means for specifying a desired energizing cycle interval after completion of welding and supplying reference values for setting up a monitoring level of the welding current;
    a selection means for selecting and drawing current values in the desired energizing cycle interval from said memory means;
    an arithmetic unit for obtaining mean, maximum and minimum values of welding current in the desired energizing cycle interval;
    a comparator for comparing the values obtained from said arithmetic unit with said reference values and
    a display unit for displaying the current values in the desired energizing cycle interval.

4. A welding current measuring apparatus for a resistance welding machine, comprising:
    a current detector for detecting welding current flowing through said resistance welding machine;
    memory means for successively storing and holding the current detected;
    a setting means for setting an energizing cycle interval for which a display of waveforms of the welding current is carried out;
    a selecting circuit for drawing current value data in the energizing cycle interval set by said setting means; and
    a waveform displaying unit for displaying current value data outputted from said selecting circuit as a current waveform; wherein
    any energizing cycle interval is specified after completion of welding so that the current flowing in the specified interval is displayed as the current waveform.

* * * * *